(12) United States Patent
Foster (10) Patent No.: US 10,255,020 B1
(45) Date of Patent: Apr. 9, 2019

(54) MULTI-PANEL DISPLAY HAVING BOARD-TO-BOARD INTERFACES BETWEEN ADJACENT PANELS

(71) Applicant: Ultravision Technologies, LLC, Dallas, TX (US)

(72) Inventor: Matthew Foster, Flower Mound, TX (US)

(73) Assignee: ULTRAVISION TECHNOLOGIES, LLC, Dallas, TX (US)

(*) Notice: Subject to any disclaimer, the term of this patent is extended or adjusted under 35 U.S.C. 154(b) by 0 days.

(21) Appl. No.: 15/824,544

(22) Filed: Nov. 28, 2017

(51) Int. Cl.
*G06F 3/14* (2006.01)
*G09G 3/3233* (2016.01)
*G09F 13/22* (2006.01)

(52) U.S. Cl.
CPC ......... *G06F 3/1446* (2013.01); *G09G 3/3233* (2013.01); *G09F 2013/222* (2013.01); *G09G 2300/026* (2013.01); *H05K 2201/10106* (2013.01); *H05K 2201/10128* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,036,956 B1 * | 5/2006 | Chou | ................ | G02F 1/133603 361/742 |
| 2009/0296026 A1 * | 12/2009 | Bae | ....................... | G02B 6/008 349/65 |
| 2010/0128195 A1 * | 5/2010 | Li | ..................... | G02F 1/133603 349/58 |
| 2010/0165236 A1 * | 7/2010 | Bae | ...................... | G02B 6/0021 349/58 |
| 2010/0265425 A1 * | 10/2010 | Kawaguchi | ....... | G02F 1/133308 349/58 |
| 2010/0320490 A1 * | 12/2010 | Lin | ......................... | H01L 33/58 257/98 |
| 2011/0187204 A1 * | 8/2011 | Lacey | .................... | H03K 17/96 307/139 |
| 2013/0107157 A1 * | 5/2013 | Yang | ................ | G02F 1/133308 349/58 |
| 2015/0198760 A1 * | 7/2015 | Wilcox | ............... | G02B 6/0038 362/606 |
| 2015/0253484 A1 * | 9/2015 | Araki | .................. | G02B 6/0031 349/65 |

* cited by examiner

*Primary Examiner* — Van N Chow
(74) *Attorney, Agent, or Firm* — Slater Matsil, LLP (57) ABSTRACT

An embodiment display panel includes a printed circuit board (PCB) including a lower portion and an upper portion disposed over and overhanging the lower portion of the PCB. The display panel further includes a plurality of light emitting diodes (LEDs) disposed at a front side of the upper portion of the PCB, where the front side of the upper portion of the PCB forms an entirety of a front surface of the display panel. The display panel also includes a housing having a recess, where the lower portion of the PCB is at least partially disposed within the recess, where framing portions of the housing are laterally adjacent to the lower portion of the PCB, and where the upper portion of the PCB overhangs the framing portions of the housing.

20 Claims, 10 Drawing Sheets

MULTI-PANEL DISPLAY HAVING BOARD-TO-BOARD INTERFACES BETWEEN ADJACENT PANELS

TECHNICAL FIELD

The present disclosure relates generally to displays including a plurality of display panels, and, in particular embodiments, to a multi-panel display having board-to-board interfaces between adjacent panels.

BACKGROUND

Large displays (e.g., billboards), such as those commonly used for advertising in cities and along roads, are widely used to display images, video, or text. The graphics may be projected on a single panel or extended across multiple panels. Each panel of a multi-panel display may have an array of light emitting diodes (LEDs) to generate the visual graphics. The LED panels may be conventional panels made using discrete LEDs or surface-mounted device (SMD) panels. Most outdoor screens and some indoor screens are built around discrete LEDs, which are also known as individually mounted LEDs. A cluster of red, green, and blue diodes, or alternatively, a tri-color diode, is driven together to form a full-color pixel, usually square in shape. These pixels are spaced evenly apart for a given panel. It may be desirable to provide a multi-panel display where pixels are spaced evenly apart across the entire multi-panel display.

SUMMARY

An embodiment display panel includes a printed circuit board (PCB) including a lower portion and an upper portion disposed over and overhanging the lower portion of the PCB. The display panel further includes a plurality of light emitting diodes (LEDs) disposed at a front side of the upper portion of the PCB, where the front side of the upper portion of the PCB forms an entirety of a front surface of the display panel. The display panel also includes a housing having a recess, where the lower portion of the PCB is at least partially disposed within the recess, where framing portions of the housing are laterally adjacent to the lower portion of the PCB, and where the upper portion of the PCB overhangs the framing portions of the housing.

An embodiment modular digital display system includes a support structure including a plurality of vertical beams and a plurality of horizontal beams; and a plurality of digital display panels mounted to the support structure so as to form an integrated display panel. The integrated display panel includes a display surface, where the support structure is configured to provide mechanical support to the plurality of digital display panels. Each of the plurality of digital display panels includes a printed circuit board assembly (PCBA) including a back portion and front portion disposed over and overhanging the back portion of the PCBA; a plurality of light emitting diodes (LEDs) disposed at an exterior-facing surface of the front portion of the PCBA, where the exterior-facing surface of the front portion of the PCBA forms an entirety of a front surface of the digital display panel; and a housing including a recess, where the back portion of the PCBA is disposed within the recess, where framing portions of the housing are laterally adjacent to the back portion of the PCBA, where the front portion of the PCBA overhangs the framing portions of the housing, and where PCBAs of immediately adjacent digital display panels are in physical contact.

A digital display panel includes a printed circuit board (PCB) including a lower portion and an upper portion disposed over and overhanging the lower portion of the PCB; a plurality of light emitting diodes (LEDs) disposed at a front side of the upper portion of the PCB, where the front side of the upper portion of the PCB forms an entirety of a front surface of the digital display panel; a housing including a recess, where the lower portion of the PCB is at least partially disposed within the recess, where framing portions of the housing are laterally adjacent to the lower portion of the PCB, where the upper portion of the PCB overhangs the framing portions of the housing, and where no portion of the housing extends past the upper portion of the PCB in a top-down view of the digital display panel; and a receiver circuit mounted to a backside of the lower portion of the PCB, where the receiver circuit is disposed within the recess of the housing.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

This disclosure provides many applicable inventive concepts that can be embodied in a wide variety of specific contexts. The specific embodiments discussed are merely illustrative of specific ways to make and use the invention, and do not limit the scope of the invention.

In the following embodiments, exterior displays are used herein for purposes of example. It is understood that the present disclosure may be applied to lighting for any type of interior and/or exterior display.

Figure 1A:
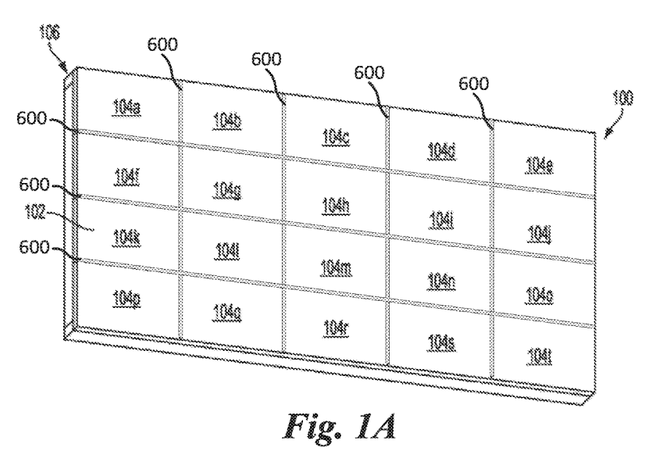
FIGS. 1A and 1B respectively illustrate a front-view and a back-view of a multi-panel display, in accordance with an embodiment.
Figure 1B:
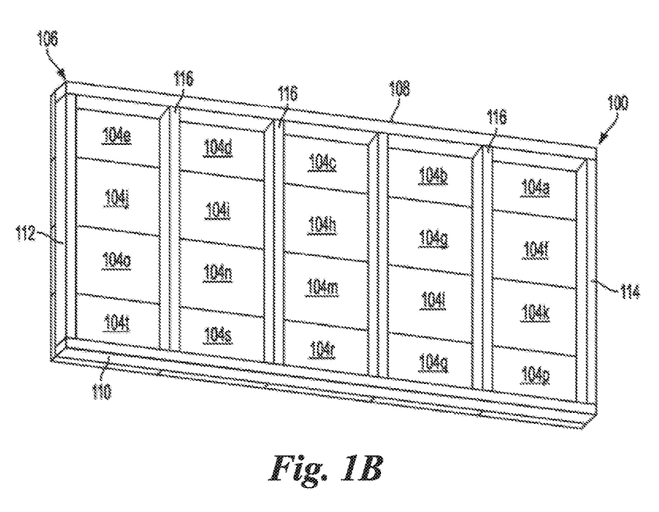

FIGS. 1A and 1B respectively illustrate a front-view and a back-view of a multi-panel display 100, in accordance with an embodiment. The multi-panel display 100 (hereinafter referred to as a "display") includes a display surface 102 formed by a plurality of lighting panels 104a-104t (hereinafter referred to as "panels 104") arranged as an array of panels 104. Each panel 104 of each row of the array of panels 104 is electrically connected to an adjacent panel 104 within that row. In the present embodiment, the panels 104 use light emitting diodes (LEDs) for illumination; however, other light sources may be used in other embodiments. The panels 104 typically operate together to form a single image across the display surface 102, although multiple images may be simultaneously displayed by the display 100. In the present example, each of the panels 104 is attached to a frame 106 (e.g. shown in FIG. 1B), which enables each of the panels 104 to be installed or removed from the display 100 without affecting other panels 104.

In the display 100 of FIGS. 1A and 1B, each panel 104 is a self-contained unit that couples directly to the frame 106. By "directly," it is understood that another component or components may be positioned between the panel 104 and the frame 106, but the panel 104 is not placed inside weather protection cabinetry that is coupled to the frame 106. For example, an alignment plate may be coupled to a panel 104 and/or the frame 106 to aid in aligning a panel 104 with other panels 104. Further a corner plate could be used. The panel 104 may then be coupled to the frame 106 or the alignment plate and/or corner plate, and either coupling approach would be "direct" according to the present disclosure.

A first panel 104 can be coupled, for power and/or data purposes, with a second panel 104 that receives power and/or data from a central source or a third panel 104. The second panel 104 may also pass through at least some of the power and/or data to a fourth panel 104. This further improves the modular aspect of the display 100, since a single panel 104 can be easily installed in the display 100 by coupling the power and data connections of the single panel 104 to neighboring panels 104. Similarly, a single panel 104 can be easily disconnected from the display 100 by decoupling the power and data connections of the single panel 104 from neighboring panels 104.

The power and data connections for the panels 104 may be configured using one or more layouts, such as a ring, mesh, star, bus, tree, line, or fully-connected layout, or a combination thereof. In some embodiments, the panels 104 may be in a single network; in other embodiments, the panels 104 may be divided into multiple networks. Power and data may be distributed using identical or different layouts. For example, power may be distributed in a line layout, while data may use a combination of line and star layouts.

The frame 106 that supports the panels 104 may be relatively light in weight compared to frames needed to support cabinet-mounted LED assemblies. In the present example, the frame 106 includes a top horizontal member 108, a bottom horizontal member 110, a left vertical member 112, a right vertical member 114, and intermediate vertical members 116, as illustrated in FIG. 1B. Power cables and data cables (not shown in FIGS. 1A-1B) for the panels 104 may route around and/or through the frame 106.

In one embodiment, the display 100 includes 336 panels 104 to create a 14 feet×48 feet display 100. In such an embodiment, the entire display 100 could be built to weigh only 5500 pounds. This compares favorably to commercially available displays of similar size, which generally weigh from 10,000 to 12,000 pounds. In another embodiment, the display 100 includes 320 panels 104 arranged in ten rows and thirty-two columns to create an approximately 16 feet×50 feet display 100.

Figure 2A:
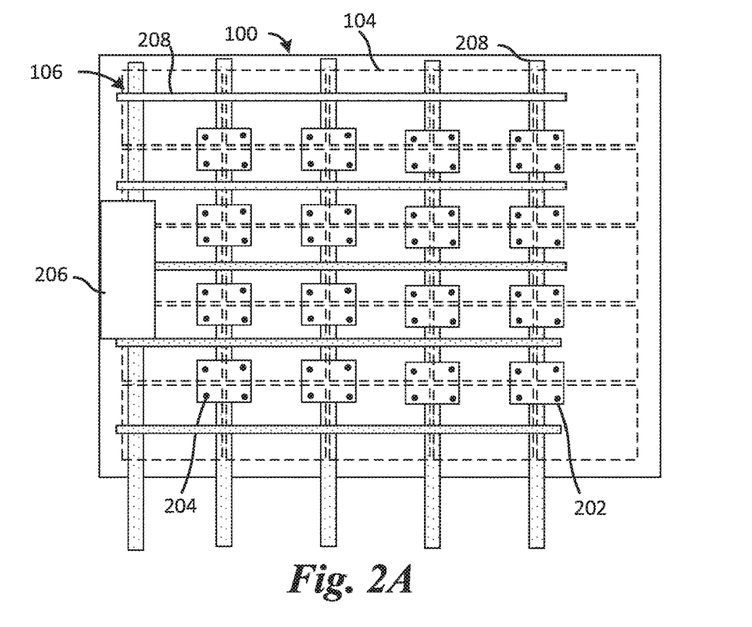
FIGS. 2A-2D illustrate back-views of panels attached to a frame of a multi-panel display, in accordance with various embodiments.

FIGS. 2A-2D illustrate back-views of panels 104 attached to the frame 106 of the display 100, in accordance with various embodiments. As depicted in FIG. 2A, the panels 104 are stacked next to and/or above each other (e.g. as an array) and are securely attached to the frame 106 using an attachment plate 202, which may be a corner plate. The attachment plate 202 may include holes through which attachment features 204 may be disposed. FIG. 2A shows a data receiver box 206 mounted or secured to frame 106. The data receiver box 206 is configured to provide power, data, and communication to the panels 104. With a shared receiver box 206, the panels 104 themselves do not need a respective or individual receiver card, and such a configuration can save cost and weight.

Figure 2B:
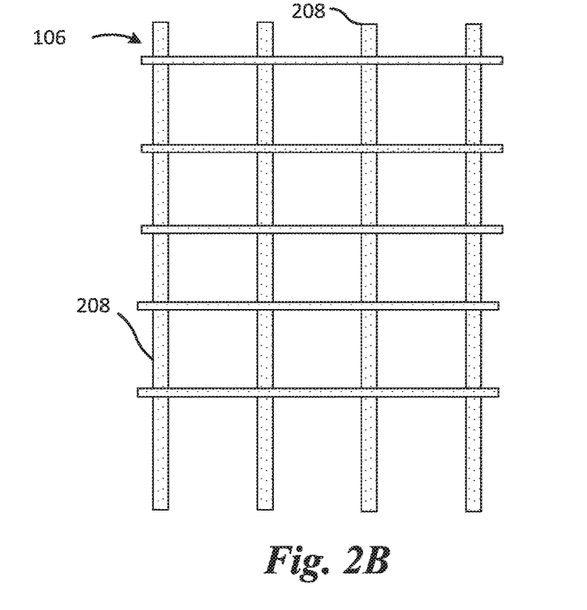

Referring to FIG. 2B, the frame 106 provides mechanical support and electrical connectivity to each of the panels 104. The frame 106 includes a plurality of beams 208 forming the mechanical structure. The frame 106 of FIG. 2B includes a top bar, a bottom bar, a left bar, and a right bar, which demarcate the outer boundary of the frame 106. The frame 106 also includes a plurality of vertical bars extending from the top bar to the bottom bar and disposed between the left bar and the right bar. The top bar, the bottom bar, the left bar and the right bar may be 4" aluminum bars and the vertical bars may be 2"×4"×½" aluminum tubes. The top bar, the bottom bar, the left bar and the right bar may each be capable of bearing a load of 1.738 lb./ft., and the vertical bars may each be capable of bearing a load of 3.23 lb./ft.

The frame 106 may include support structures for the electrical cables, data cables, electrical power box powering the panels 104. The frame 106 does not include any additional enclosures to protect the panels 104, the data cables, or the power cables from the environment. Rather, the frame 106 is exposed to the elements and further exposes the panels 104 to the environment. The frame 106 also does not include air conditioning, fans, heating units to maintain the temperature of the panels 104. Rather, each of the panels 104 is hermetically sealed and is designed to be exposed to the outside ambient. Further, in various embodiments, there are not additional weather protection cabinetry that are attached to the frame 106 or used for housing the panels 104. Accordingly, in various embodiments, the display 100 is designed to be passively cooled.

Figure 2C:
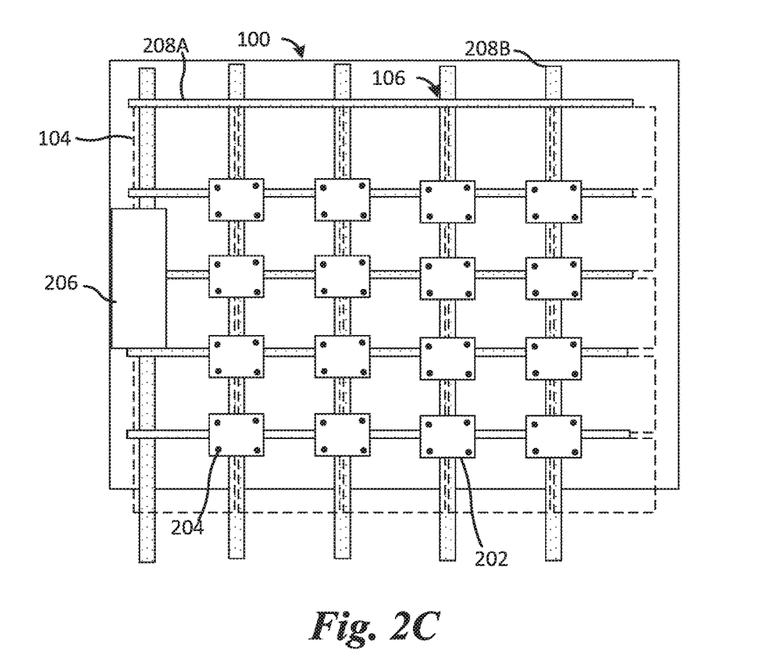
Figure 2D:
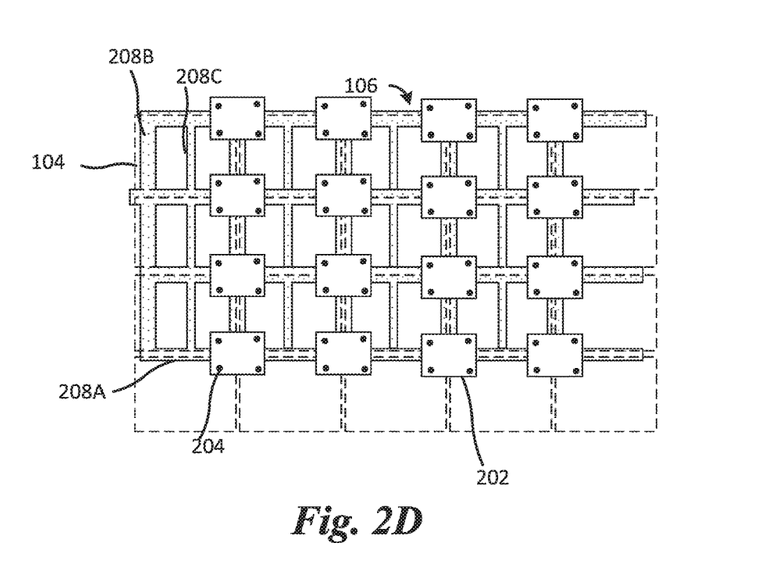

FIGS. 2C and 2D illustrate alternative embodiments of the display 100 attached to the frame 106. The embodiment shown in FIG. 2C differs from embodiment described in FIG. 2A in that the horizontal beams 208A shown in FIG. 2C may be used to support the panels 104. In one embodiment, both horizontal beams 208A and vertical beams 208B may be used to support the panels 104. In another embodiment, horizontal beams 208A but not the vertical beams 208B may be used to support the panels 104, although the vertical beams 208B may be used to reinforce the frame 106 rather than directly support the panels 104. The embodiment shown in FIG. 2D shows that the frame 106 may include additional beams 208C, which may be narrower in width than the other beams of the frame 106. One or more of the thinner beams 208C may be placed between the regular sized vertical beams 208B, e.g., to reinforce the frame 106.

Figure 3A:
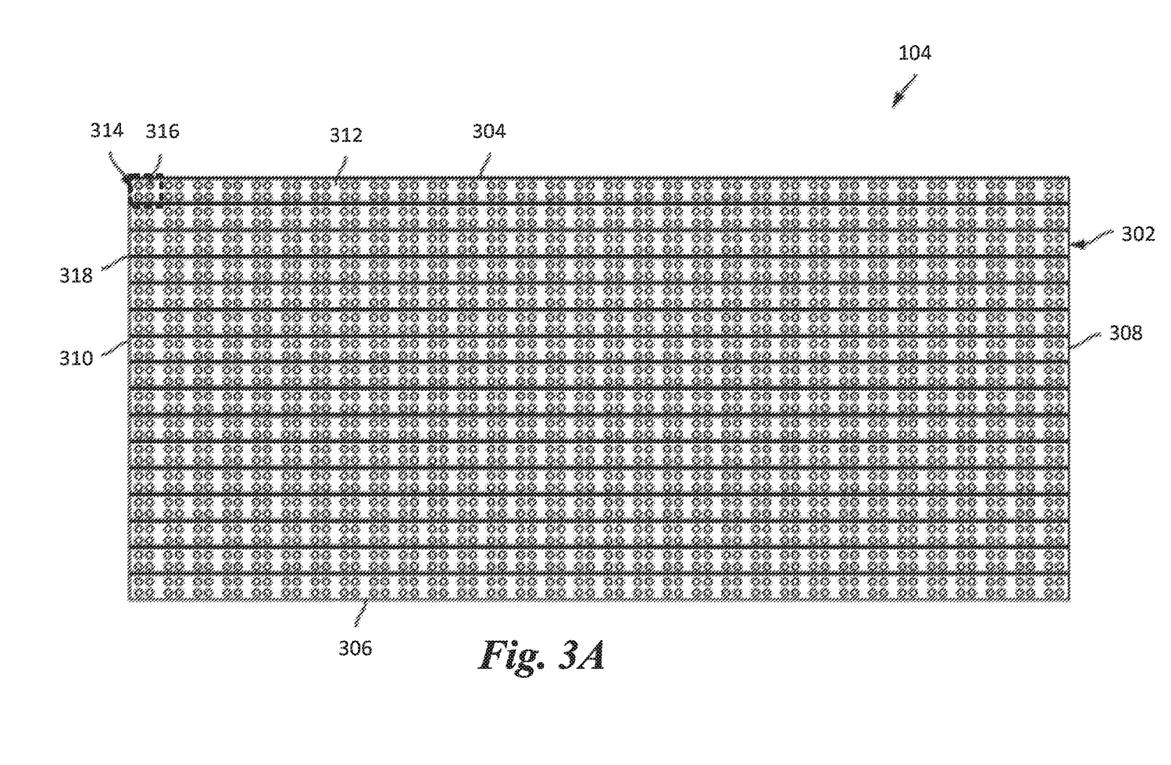
FIG. 3A illustrates a front view of a panel with illumination elements arranged in a 16×32 configuration, in accordance with an embodiment.
Figure 3B:
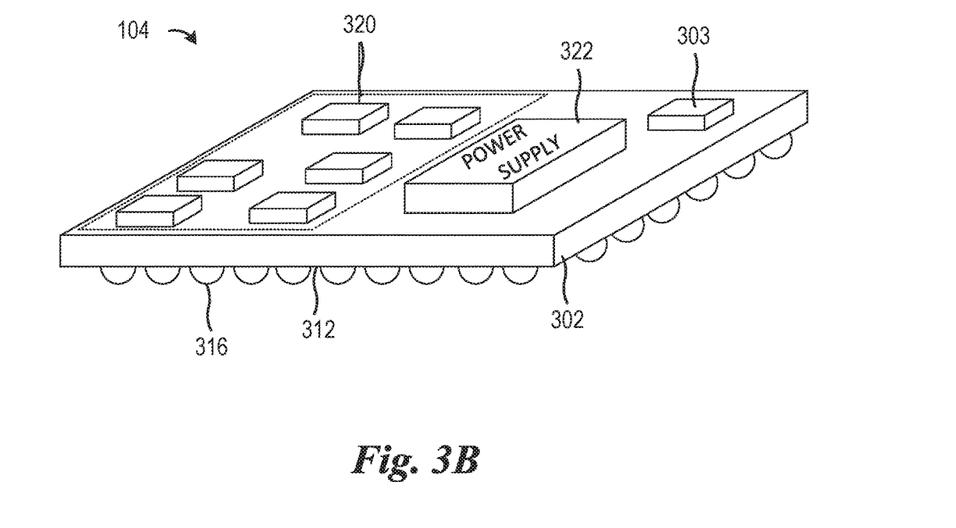
FIG. 3B illustrates a panel including a printed circuit board assembly, where a power supply and an light emitting diode (LED) receiver circuit of the panel are assembled on the same printed circuit board as the illumination elements of the panel 104, in accordance with an embodiment.

FIGS. 3A-3B show various aspects of a panel 104, in accordance with an embodiment. FIG. 3A illustrates a front view of the panel 104 with illumination elements (e.g. LEDs) arranged in a 16×32 configuration, in accordance with an embodiment. FIG. 3B illustrates an embodiment where the panel 104 includes a printed circuit board (PCB) assembly (PCBA), where a power supply and an LED receiver circuit are assembled on the same PCB as the illumination elements of the panel 104.

Referring to the example of FIG. 3A, the panel 104 includes a PCBA 302 that forms at least a portion of the front surface of the panel 104. The panel 104 may have a width W (e.g. between 1 foot and 4 feet) and a height H (e.g. between 0.5 feet to 2 feet), although other dimensions may be possible. In some embodiments, a ratio of the height H to the width W may be about 0.5. The PCBA 302 in the present embodiment is rectangular in shape, with a top edge 304, a bottom edge 306, a right edge 308, and a left edge 310.

A PCBA surface 312 includes "pixels" 314 that are formed by one or more LEDs 316 on or within the PCBA 302. In the present example, each pixel 314 includes four LEDs 316 arranged in a pattern (e.g., a square). For example, the four LEDs 316 that form a pixel 314 may include a red LED, a green LED, a blue LED, and one other LED (e.g., a white LED). In some embodiments, the one other LED may be a sensor. It is understood that more or fewer LEDs 316 may be used to form a single pixel 314, and the use of four LEDs 316 and their relative positioning as a square is for purposes of illustration only.

In some embodiments, the LEDs 316 may be of a dual in-line package (DIP) LED type. In DIP LED technology, the DIP LED may only display one color per device. As a result, a blue diode, a green diode, and a red diode are typically positioned proximate to each other to form a pixel. DIP diodes typically have a bullet shape design, are generally soldered to a printed circuit board, and may generate between 35 and 80 lumens per watt. Alternatively, in some embodiments, the LEDs 316 may be of a surface-mount device (SMD) LED module type. In an SMD LED module, the LED module is a self-contained surface-mounted LED device that is usually mounted to the PCBA 302. SMD LED's are typically less bulky in comparison with DIP LEDs, generally having a flat design. As SMD LED's have the Red Green Blue (RGB) capability on a single chip, an adjustment of the level output from each diode on the chip creates a desired output color. A typical SMD LED can produce between 50 and 100 lumens per watt. Other types of LED technology such as organic LED (OLED), edge emitting LED (ELED), chip on board (COB) and multiple chip on board (MCOB), where multiple diodes are positioned on a same chip, can be used in the panel 104.

Louvers 318 may be positioned between adjacent rows of pixels 314 to block or minimize light from directly striking the LEDs 316 from certain angles. For example, the louvers 318 may be configured to extend from the PCBA 302 to a particular distance and/or at a particular angle needed to completely shade each pixel 314 when a light source (e.g., the sun) is at a certain position (e.g., ten degrees off vertical). In the present example, the louvers 318 extend across the entire length of the PCBA 302, but it is understood that other louver configurations may be used.

Referring to FIG. 3B, one embodiment of the panel 104 illustrates that the panel 104 includes an LED receiver circuit 320, a power supply 322, and the LEDs 316 on or within the PCBA 302. The LED receiver circuit 320 is coupled to the LEDs 316 (e.g. by circuitry extending through a thickness of the PCBA 302). The power supply 322 provides power to the panel 104 components, such as the LEDs 316 and the LED receiver circuit 320. In addition to the LED receiver circuit 320 and the power supply 322 circuitry, the PCBA 302 may have other components 303, for example, a controller that is used to control and adjust specific settings of the panel 104.

In an embodiment, the LED receiver circuit 320 may be a chip mounted on the PCBA 302. The LED receiver circuit 320 may be configured to process received media and control the operation of the individual LEDs 316. As an example, the LED receiver circuit 320 may determine the color of the LEDs 316 to be displayed at each location (pixel). In an embodiment, the LED receiver circuit 320 may receive digital packets or analog signals from an external computer or controller. The LED receiver circuit 320 may then decode, buffer, or perform other signal processing on the received digital packets or analog signals and form a representation of an image to be displayed by controlling the LEDs 316 accordingly.

Similarly, the LED receiver circuit 320 may determine the brightness at each pixel 314 location, for example, by controlling the current supplied to the LEDs 316. In another embodiment, the brightness of the LED 316 may be controlled by turning the LED 316 on and off via pulse-width-modulation (PWM). In some embodiments, the LED receiver circuit 320 and the power supply 322 are configured with both capabilities.

The power supply 322 is typically configured to provide a constant-current drive to the LEDs 316. In some embodiments, the power supply 322 is configured to provide a constant Direct Current (DC) voltage to the LEDs. In an embodiment, the power supply 322 may include a power converter for converting Alternating Current (AC) to DC, which is then supplied to the LEDs 316. In an embodiment, the power supply 322 converts a 240V or 120V AC to several volts up to in some cases 24V DC. As an example, the panel 104 may operate at 4.2 V DC, for example, providing 160 Watts to the LEDs 316 of the panel 104. Advantageously, the panel 104 can handle either 240V or 120V AC and is therefore compatible worldwide.

In another embodiment, the power supply 322 may include a down converter that down converts the voltage suitable for driving the LEDs 316. As an example, the down converter may down convert a DC voltage at a first level (e.g., 12V, 24V, or 48V DC) to a DC voltage at a second level (e.g., 4.2V DC) that is lower than the first level. Examples of down converters (DC-DC converters) include linear regulators and switched mode converters such as buck converters.

In some embodiments, the output from the power supply 322 is isolated from the input power, also known as isolated converters. Accordingly, in various embodiments, the power supply 322 may include a transformer. In another embodiment, the power supply 322 may include forward, half-bridge, full-bridge, or push-pull topologies.

In some embodiments, the ground of the power supply 322 may be isolated from the LED receiver circuit 320 to reduce noisy ground loops (not shown as it is implemented in the board layout, which is internal to the PCBA 302). In an electrical system, a ground loop occurs when a ground reference at two different locations of a circuit have different potentials. A ground loop can cause interference and noise in the video feed and at the LED receiver circuit 320. In an embodiment, the power supply 322 may be placed inside a faraday cage to minimize RF interference with other components. The power supply 322 may also include a control loop circuit to control output current.

Each panel 104 may have ports and mounting latches to connect to adjacent panels. In these embodiments, data and/or power may be received for only the panel 104 or may be passed on to one or more other panels. Accordingly, the LED receiver circuit 320 and/or power supply 322 may be configured to pass data and/or power to other panels in some embodiments. The control signals and external power may also be fed to each panel in a daisy chain or individually. In some embodiments, the panel may have a socket for registered jack (RJ) 45 standard interface. The RJ45 interface allows the display panel to receive signals digital packets or analog signals from an external computer.

Figure 4:
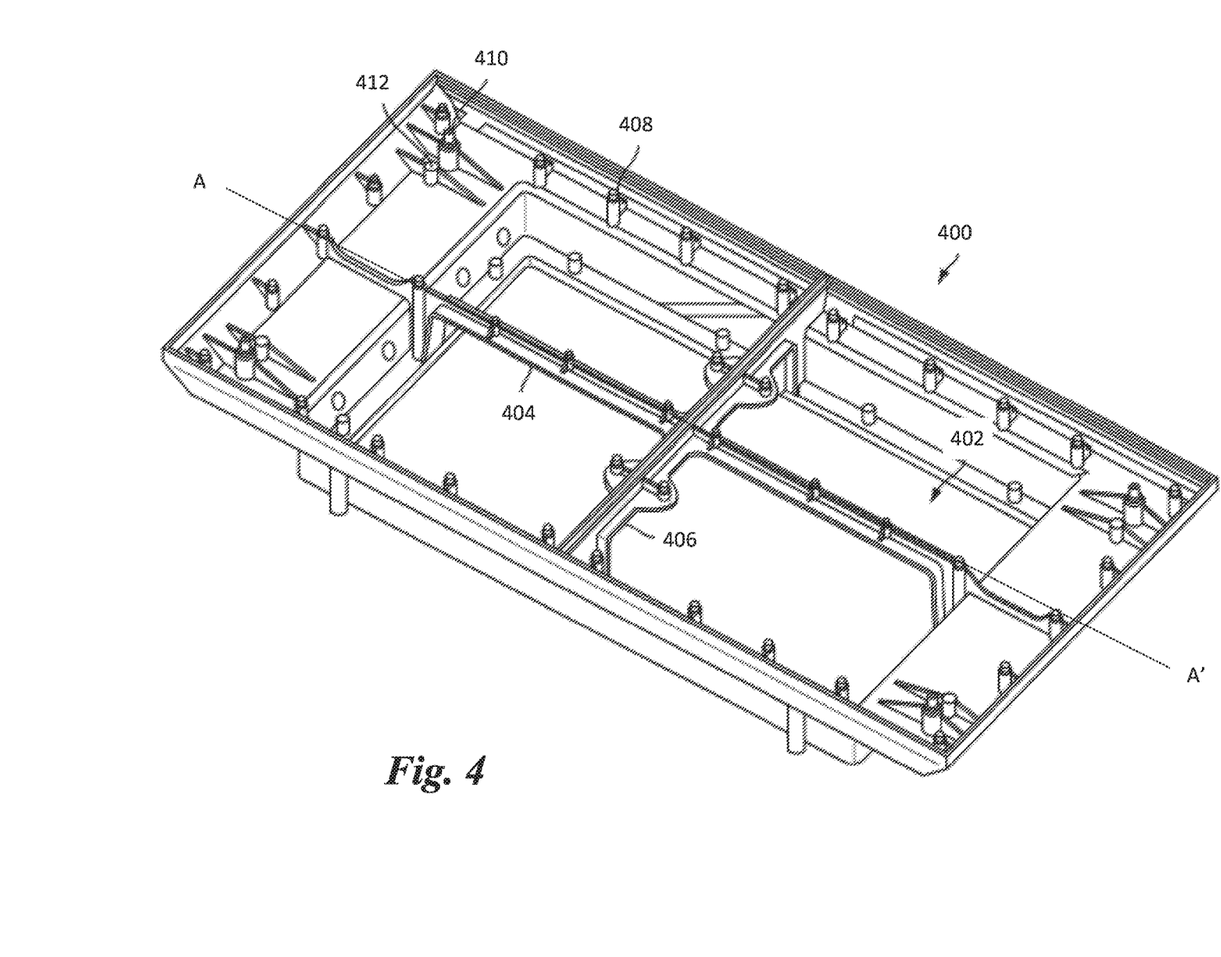
FIG. 4 illustrates a housing that may enclose the printed circuit board assembly, the LED receiver circuit, and the power supply shown in FIG. 3B, in accordance with an embodiment.

FIG. 4 illustrates a housing 400 that may enclose the PCBA 302, the LED receiver circuit 320, and the power supply 322 shown in FIG. 3B, in accordance with an embodiment. As shown in FIG. 4, the housing 400 defines a cavity 402 (which may also be referred to as a recess). Structural cross-members 404 and 406 may be used to provide support to the PCBA 302. The cross-members 404 and 406, as well as other areas of the housing 400, may include supports 408 against which the PCBA 302 can rest when placed into position. As shown, the supports 408 may include a relatively narrow tip section that can be inserted into a receiving hole in the back of the PCBA 302 and then a wider section against which the PCBA 302 can rest.

The housing 400 may also include multiple extensions 410 (e.g., sleeves) that provide screw holes or locations for captive screws that can be used to couple the PCBA 302 to the housing 400. Other extensions 412 may be configured to receive pins or other protrusions from the attachment plate 202, which secures the housing 400 to the frame 106, as described above in relation to FIGS. 2A-2D. Some or all of the extensions 412 may be accessible only from the rear side of the housing 400 (e.g. through a back cover that defines a back surface of the housing 400 and that encloses the cavity 402) and so are not shown as openings in FIG. 4.

Figure 5:
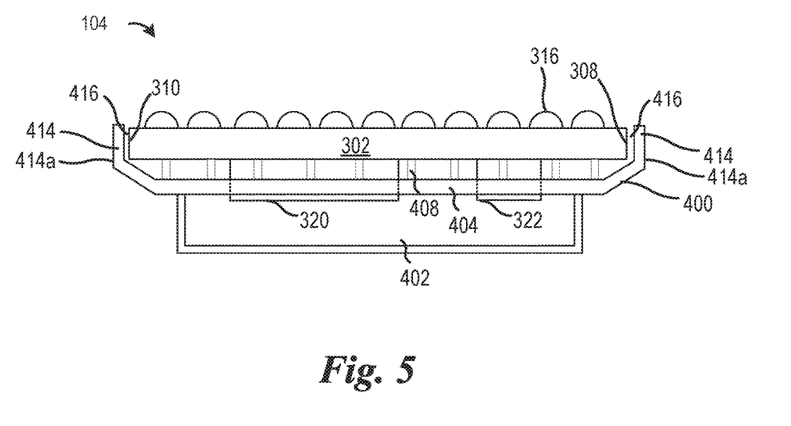
FIG. 5 shows a cross-sectional view of a panel 104, including a housing and a printed circuit board assembly disposed within the housing, in accordance with an embodiment.

FIG. 5 shows a cross-sectional view of the panel 104, including the housing 400 and the PCBA 302 disposed within the housing 400, in accordance with an embodiment. The cross-sectional view shown in FIG. 5 is taken along the line A-A' shown in FIG. 4 and may be conventional panel 104 where portions 414 of the housing 400 are laterally adjacent to the PCBA 302 (e.g. to facilitate a seal that protects circuitry housed within the recess 402 of the housing 400 from the elements). For example, as shown in FIG. 5, the PCBA 302 rests against supports 408 of the housing 400. The LED receiver circuit 320 and the power supply 322 are disposed within the recess 402 of the housing 400, while the LEDs 316 are disposed at the front surface of the panel 104. As shown in FIG. 5, the housing 400 includes framing portions 414 that are laterally adjacent to the right edge 308 and the left edge 310 of the PCBA 302. As such, for each panel 104 of the display 100, the framing portions 414 of the housing 400 may visible at one or more of the edges of the PCBA 302.

The housing 400 is sealed to prevent water from entering the housing 400. For example, the housing 400 may be sealed to have an ingress protection (IP) rating such as IP67, which defines a level of protection against both solid particles and liquids. This ensures that the panel 104 can be mounted in inclement weather situations without being adversely affected. To achieve such sealing, a potting material or a silicone-based material can be formed over the LEDs 316. This material can be applied as a liquid, e.g., while heated. The liquid material then flows into the gaps 416 between the framing portions 414 of the housing 400 and the edges of the PCBA 302. The liquid material subsequently hardens (e.g., when cooled) and seals the housing 400, preventing ingress of solid particles and liquids into the recess 402 of the housing 400.

Figure 6:
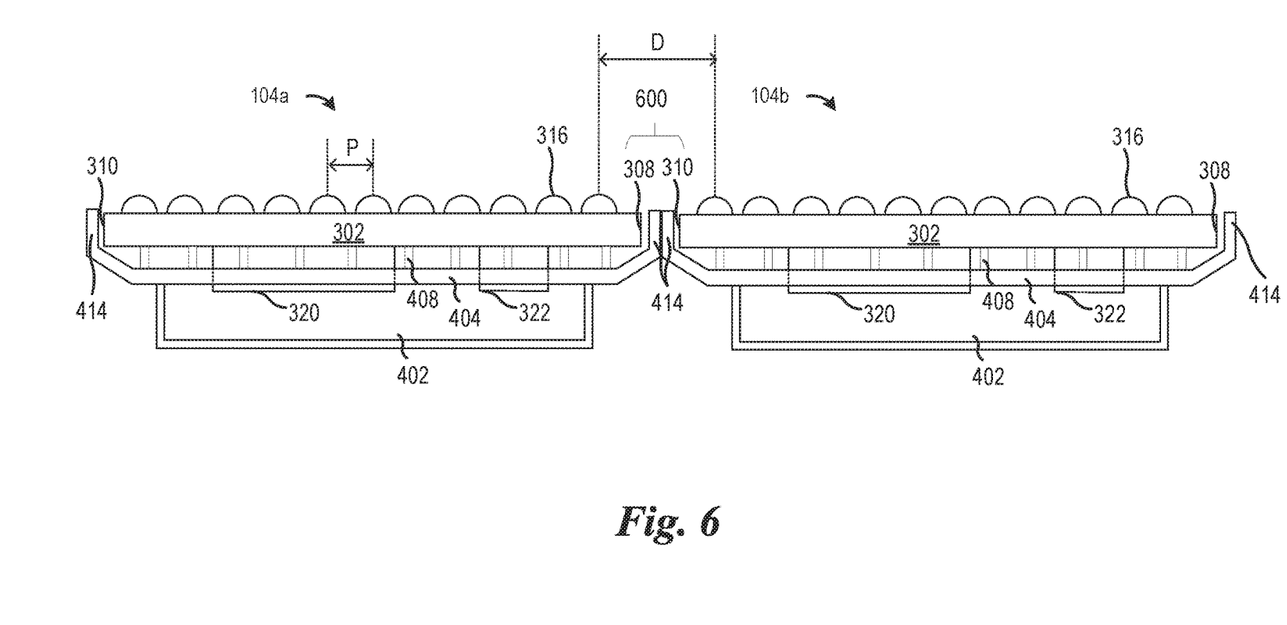
FIG. 6 illustrates a first panel stacked next to a second panel to form a portion of a multi-panel display, where each panel has the structure shown in FIG. 5, in accordance with an embodiment.

As described above, the panels 104 are stacked next to and/or above each other (e.g. as an array) to form the display 100. FIG. 6 shows an embodiment where first panel 104a is stacked next to second panel 104b to form a portion of the display 100. As shown in FIG. 6, framing portions 414 of the housings 400 of adjacent panels 104a, 104b may form a region 600 that is devoid of LEDs 316 and where exterior sidewalls 414a of the framing portions 414 of adjacent panels 104a, 104b are next to each other. This region 600 is also depicted in FIG. 1A.

The LEDs 316 of a given panel 104 may have a pitch P. In other words, immediately adjacent LEDs 316 of a given panel 104 may be separated by a distance P, which may range between 5 mm and 8 mm. As an example, when the display 100 is used outdoors, the distance P may be between 7 mm and 8 mm (e.g. about 7.62 mm). As another example, when the display 100 is used indoors, the distance P may be about 5 mm.

However, due to the region 600, immediately adjacent LEDs 316 of different panels 104 may be separated by a distance D, which is may be different from (e.g. greater than) the pitch P. As such, the presence of framing portions 144 between adjacent PCBAs 302 may limit the pixel pitch across the display 100 and cause the display 100 to have regions 600 that manifest as seams across the image displayed on display 100. In general, the housing 400 may be made of thermally conductive plastic that is relatively lightweight and rigid. Due to expansion and contraction of the housing 400 and/or inconsistencies in production of the housing 400, the framing portions 414 of the housing 400 may bow out or cave in. As such, the exterior sidewalls 414a of the framing portions 414 of the housing 400 may cease to be flat surfaces.

The difference between the distance D and the pitch P may also be attributed to the inconsistencies in the shape of the framing portions 414 of the adjacent housings 400 (e.g. due to expansion and contraction of the housing 400 and/or inconsistencies in production of the housing 400). Additionally or alternatively, each panel 104a, 104b needs to be secured to (e.g. bolted to) the frame 106, as described above in reference to FIGS. 1A, 1B, and 2A-2D. In such a scenario, the bolt/securement positions on the frame 106 may result in a gap between first panel 104a and second panel 140b such that the framing portions 414 of the adjacent housings 400 are not in physical contact with each other. This may also manifest as seams across the image displayed on display 100.

The above-identified disadvantages of a conventional panel 104 may be solved by a software adjustment that adjusts the brightness of LEDs 316 disposed at the edges of the PCBA 302 in an attempt to visually hide the seams across the image displayed on display 100. Other possible solutions include manufacturing the housing 400 using materials that have more controllable tolerances (e.g. aluminum, carbon fiber composite, titanium alloys). However, such solutions may increase production cost and time and also drive up after-installation debugging time.

In view of these disadvantages of a conventional panel, embodiments described herein include a panel where the PCBA and the housing of each panel of the display 100 are adjusted to allow for a PCBA-to-PCBA interface between adjacent panels (e.g. instead of the scenario in FIG. 6 showing a framing portion-to-framing portion interface between adjacent panels 104a, 104b). Such embodiments allow for a tighter seam between adjacent panels, while maintaining a seal for each panel that protects circuitry of each panel from the elements. Such embodiments also maintain the use of plastic in the housing and the use of plastic as the material for the housing. This results in cheaper and lighter panels, in comparison to solutions that make the housing from materials that have more controllable tolerances (e.g. aluminum, carbon fiber composite, titanium alloys).

Figure 7:
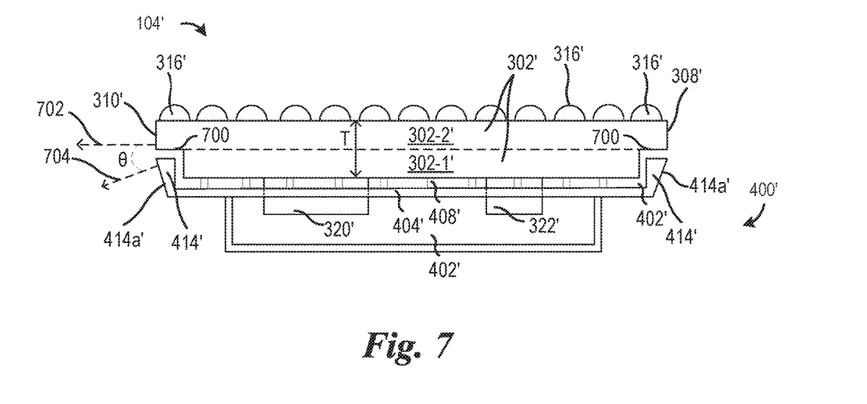
FIG. 7 shows a cross-sectional view of a panel 104, including a printed circuit board assembly that extends across an entire front surface of the panel, in accordance with an embodiment.

FIG. 7 shows a cross-sectional view of a panel 104' includes a PCBA 302' extends across an entire front surface of the panel 104', in accordance with an embodiment. In the example shown in FIG. 7, the housing 400' includes recess 402' that is configured to enclose the LED receiver circuit 320' and/or the power supply 322' of the panel 104', which are attached to a back-side of the PCBA 302'. The PCBA 302' includes a front side, which forms the entire front surface of the panel 104'. In other words, the width and length of the panel 104' is equal to the width and length of the PCBA 302'. The LEDs 316' are formed at the front side of the PCBA 302'. In some embodiments, such as in the example of FIG. 7, the back-side of the PCBA 302' rests on supports 408' that protrude from cross-member 404' of the housing 400'. As shown in FIG. 7, the PCBA 302' has a thickness T, which may be between 2 mm and 3 mm. The PCBA 302' includes a first portion 302-1' (e.g. a lower portion) disposed within the housing 400'. The housing 400' includes framing portions 414' that are laterally adjacent to the first portion 302-1' of the PCBA 302'. The PCBA 302' also includes a second portion 302-2' (e.g. an upper portion) that overhangs the first portion of the PCBA 302' and the framing portions 414' of the housing 400'. As such, the PCBA 302' includes a lip 700 (which may be referred to as an overhang) that allows for a way to seal the PCBA 302' to the housing 400' and help place the PCBA 302' correctly into the housing 400'. The lip 700 may be formed using standard etching processes used to etch conventional printed circuit boards (e.g. including FR4 material). The lip 700 may extend a distance O from the edge of the first portion 302-2' of the PCBA 302', and the distance O may be between 0.8 mm and 2 mm.

The PCBA 302' includes left and right edges 308' and 310' that are disposed over the framing portions 414' of the housing 400' and that form outermost edges of the panel 104'. A normal to the edges 308', 310' of the PCBA 302' is depicted in FIG. 7 as arrow 702. The framing portions 414' of the housing 400 have exterior side-walls 414' that are angled. In particular, a normal to the exterior side-walls 414a' of the framing portions 414' of the housing 400' is depicted in FIG. 7 as arrow 704, and an angle θ subtended between the normal 702 to the edges 308', 310' of the PCBA 302' and the normal 704 to the exterior side-walls 414a' of the framing portions 414' of the housing 400' may be greater than about 10 degrees (e.g. in the range of about 30-45 degrees).

As shown in FIG. 7, there may be a gap between the lip 700 and the framing portions 414' of the housing 400' and a gap between the back-side of the PCBA 302' and the cross-member 404'. These gaps may need to be sealed to protect circuitry housed within the recess 402' of the housing 400' from the elements. In some embodiments, a potting material or a silicone-based material can be applied as a viscous liquid (e.g., while heated) on the back-side and/or the lip 700 of the PCBA 302', prior to mounting the PCBA 302' into the housing 400'. The PCBA 302' is subsequently flipped over and inserted into the housing 400' to form the structure shown in FIG. 7, but where the potting material or silicone-based material is disposed in the gap between the lip 700 and the framing portions 414' of the housing 400' and in the gap between the back-side of the PCBA 302' and the cross-member 404', thereby sealing the PCBA 302' and protecting circuitry housed within the recess 402' of the housing 400' from the elements.

Figure 8:
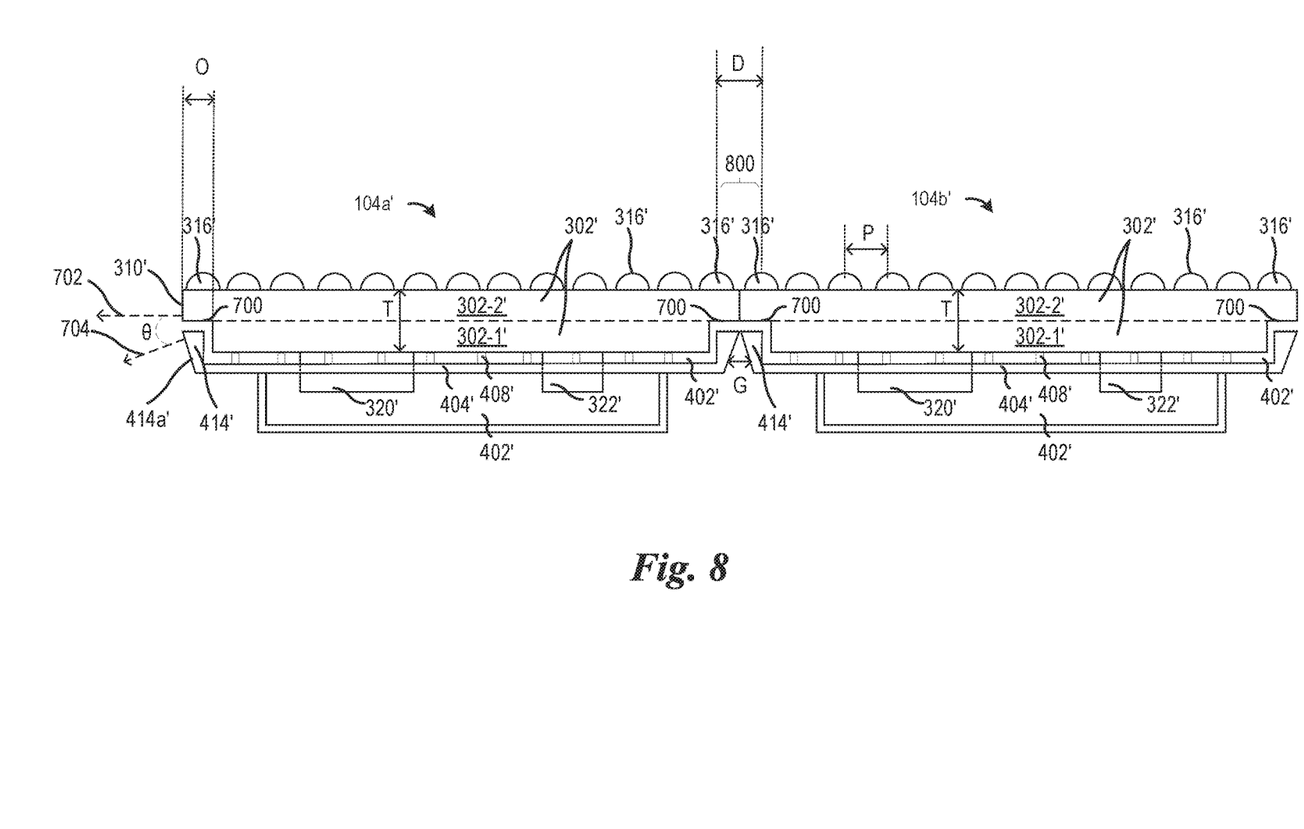
FIG. 8 illustrates a first panel stacked next to a second panel to form a portion of a multi-panel display, where each panel has the structure shown in FIG. 7, in accordance with an embodiment.

FIG. 8 shows an embodiment where first panel 104a' is stacked next to second panel 104b' to form a portion of the display 100. Each of the panels 104a' and 104b' has the structure of the panel 104' shown in FIG. 7. As shown in FIG. 8, by having each panel of the display 100 to have the structure of the panel 104' shown in FIG. 7, a PCBA-to-PCBA interface 800 is formed between adjacent panels (e.g. in contrast to the scenario in FIG. 6 where a housing-to-housing interface is formed between adjacent panels 104a, 104b). Furthermore, an effect of the angled exterior side-walls 414a' of the framing portions 414' of the housing 400' is to decrease or eliminate the effect of expansion and contraction of the housing 400' and/or inconsistencies in production of the housing 400'. For example, even if there are differences in the shapes or flatness between the framing portions 414' of adjacent housings 400', the gap G between the angled exterior side-walls 414a' of the framing portions 414' of the adjacent housings 400' prevents such inconsistencies from affecting the distance D between immediately adjacent LEDs 316' of the different panels 104a' and 104b'. In addition, as depicted in FIGS. 7 and 8, by positioning the outermost LEDs as close as possible to the edges 308' and 310' of the PCBA 302', the distance D between immediately adjacent LEDs 316' of the different panels 104a' and 104b' can approach the pitch P, thus allowing for consistent LED pitch across the entire display 100, which in turn leads to reduction or elimination of seams across the image displayed on display 100.

It is noted that tolerances achievable by PCBAs 302' are tighter than tolerances achievable by the housing 400' (which may be made of plastic). As such, even if abutting surfaces of the PCBAs 302' at the PCBA-to-PCBA interface 800 exhibit inconsistencies in shape, such inconsistencies are smaller in comparison to inconsistencies in the housing 400' and the effect of the inconsistencies between abutting surfaces of the PCBAs 302' at the PCBA-to-PCBA interface 800 on the distance D is minimal.

In summary, embodiments described herein include a panel where the PCBA and the housing of each panel of the display 100 are adjusted to allow for a PCBA-to-PCBA interface between adjacent panels (e.g. instead of the scenario in FIG. 6 showing a framing portion-to-framing portion interface between adjacent panels 104a, 104b). Such embodiments allow for a tighter seam between adjacent panels, while maintaining a seal for each panel that protects circuitry of each panel from the elements. Such embodiments also maintain the use of plastic in the housing and the use of plastic as the material for the housing. This results in cheaper and lighter panels, in comparison to solutions that make the housing from materials that have more controllable tolerances (e.g. aluminum, carbon fiber composite, titanium alloys).

An embodiment display panel includes a printed circuit board (PCB) including a lower portion and an upper portion disposed over and overhanging the lower portion of the PCB. The display panel further includes a plurality of light emitting diodes (LEDs) disposed at a front side of the upper portion of the PCB, where the front side of the upper portion of the PCB forms an entirety of a front surface of the display panel. The display panel also includes a housing having a recess, where the lower portion of the PCB is at least partially disposed within the recess, where framing portions of the housing are laterally adjacent to the lower portion of the PCB, and where the upper portion of the PCB overhangs the framing portions of the housing.

An embodiment modular digital display system includes a support structure including a plurality of vertical beams and a plurality of horizontal beams; and a plurality of digital display panels mounted to the support structure so as to form an integrated display panel. The integrated display panel includes a display surface, where the support structure is configured to provide mechanical support to the plurality of digital display panels. Each of the plurality of digital display panels includes a printed circuit board assembly (PCBA) including a back portion and front portion disposed over and overhanging the back portion of the PCBA; a plurality of light emitting diodes (LEDs) disposed at an exterior-facing surface of the front portion of the PCBA, where the exterior-facing surface of the front portion of the PCBA forms an entirety of a front surface of the digital display panel; and a housing including a recess, where the back portion of the PCBA is disposed within the recess, where framing portions of the housing are laterally adjacent to the back portion of the PCBA, where the front portion of the PCBA overhangs the framing portions of the housing, and where PCBAs of immediately adjacent digital display panels are in physical contact.

An embodiment digital display panel includes a printed circuit board (PCB) including a lower portion and an upper portion disposed over and overhanging the lower portion of the PCB; a plurality of light emitting diodes (LEDs) disposed at a front side of the upper portion of the PCB, where the front side of the upper portion of the PCB forms an entirety of a front surface of the digital display panel; a housing including a recess, where the lower portion of the PCB is at least partially disposed within the recess, where framing portions of the housing are laterally adjacent to the lower portion of the PCB, where the upper portion of the PCB overhangs the framing portions of the housing, and where no portion of the housing extends past the upper portion of the PCB in a top-down view of the digital display panel; and a receiver circuit mounted to a backside of the lower portion of the PCB, where the receiver circuit is disposed within the recess of the housing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A display panel, comprising:
  a printed circuit board (PCB) comprising a lower portion and an upper portion disposed over and overhanging the lower portion of the PCB;
  a plurality of light emitting diodes (LEDs) disposed at a front side of the upper portion of the PCB, wherein the front side of the upper portion of the PCB forms an entirety of a front surface of the display panel; and
  a housing comprising a recess, wherein the lower portion of the PCB is at least partially disposed within the recess, wherein framing portions of the housing are laterally adjacent to the lower portion of the PCB, and wherein the upper portion of the PCB overhangs the framing portions of the housing.

2. The display panel of claim 1, wherein the housing comprises a plastic material.

3. The display panel of claim 1, further comprising a sealing material disposed between overhanging regions of the upper portion of the PCB and the framing portions of the housing.

4. The display panel of claim 3, wherein the sealing material comprises a silicone-based material.

5. The display panel of claim 1, further comprising a receiver circuit mounted to a backside of the lower portion of the PCB, wherein the receiver circuit is disposed within the recess of the housing.

6. The display panel of claim 1, further comprising a power supply circuit mounted to a backside of the lower portion of the PCB, wherein the power supply circuit is disposed within the recess of the housing.

7. The display panel of claim 1, wherein a combined thickness of the upper portion and the lower portion of the PCB is between 2 mm and 3 mm.

8. The display panel of claim 1, wherein the overhang of the upper portion of the PCB extends about 1 mm from an edge of the lower portion of the PCB.

9. The display panel of claim 1, wherein the framing portions of the housing comprise an exterior sidewall directed away from the lower portion of the PCB, and wherein an angle subtended between a normal to a sidewall of the upper portion of the PCB and a normal to the exterior sidewall of the framing portions of the housing is greater than 10 degrees.

10. A modular digital display system, comprising:
  a support structure comprising a plurality of vertical beams and a plurality of horizontal beams; and
  a plurality of digital display panels mounted to the support structure so as to form an integrated display panel, the integrated display panel comprising a display surface, wherein the support structure is configured to provide mechanical support to the plurality of digital display panels, wherein each of the plurality of digital display panels comprises:
  a printed circuit board assembly (PCBA) comprising a back portion and front portion disposed over and overhanging the back portion of the PCBA;
  a plurality of light emitting diodes (LEDs) disposed at an exterior-facing surface of the front portion of the PCBA, wherein the exterior-facing surface of the front portion of the PCBA forms an entirety of a front surface of the digital display panel; and
  a housing comprising a recess, wherein the back portion of the PCBA is disposed within the recess, wherein framing portions of the housing are laterally adjacent to the back portion of the PCBA, wherein the front portion of the PCBA overhangs the framing portions of the housing, and wherein PCBAs of immediately adjacent digital display panels are in physical contact.

11. The modular digital display system of claim 10, wherein the PCBA of each of the plurality of digital display panels comprises an FR4 material.

12. The modular digital display system of claim 10, wherein the housing comprises a plastic material.

13. The modular digital display system of claim 10, wherein the overhang of the front portion of the PCBA extends about 1 mm from an edge of the back portion of the PCBA.

14. The modular digital display system of claim 10, further comprising a sealant disposed between overhanging regions of the front portion of the PCBA and the framing portions of the housing.

15. The modular digital display system of claim 14, wherein the sealant comprises a silicone-based material.

16. The modular digital display system of claim 10, wherein a distance between immediately adjacent LEDs of immediately adjacent digital display panels is equal to a distance between immediately adjacent LEDs of a given digital display panel.

17. A digital display panel, comprising:
   a printed circuit board (PCB) comprising a lower portion and an upper portion disposed over and overhanging the lower portion of the PCB;
   a plurality of light emitting diodes (LEDs) disposed at a front side of the upper portion of the PCB, wherein the front side of the upper portion of the PCB forms an entirety of a front surface of the digital display panel;
   a housing comprising a recess, wherein the lower portion of the PCB is at least partially disposed within the recess, wherein framing portions of the housing are laterally adjacent to the lower portion of the PCB, wherein the upper portion of the PCB overhangs the framing portions of the housing, and wherein no portion of the housing extends past the upper portion of the PCB in a top-down view of the digital display panel; and
   a receiver circuit mounted to a backside of the lower portion of the PCB, wherein the receiver circuit is disposed within the recess of the housing.

18. The digital display panel of claim 17, further comprising a power supply circuit mounted to a backside of the lower portion of the PCB, wherein the power supply circuit is disposed within the recess of the housing.

19. The digital display panel of claim 17, wherein the framing portions of the housing comprise an exterior sidewall directed away from the lower portion of the PCB, and wherein an angle subtended between a normal to a sidewall of the upper portion of the PCB and a normal to the exterior sidewall of the framing portions of the housing is greater than 10 degrees.

20. The digital display panel of claim 17, further comprising a silicone-based sealant disposed in a gap between the upper portion of the PCB and framing portions of the housing.

* * * * *